(12) United States Patent
Ookubo et al.

(10) Patent No.: US 7,009,259 B2
(45) Date of Patent: *Mar. 7, 2006

(54) SEMICONDUCTOR DEVICE AND METHOD OF FABRICATING SAME

(75) Inventors: Kenichi Ookubo, Kanagawa (JP); Hideki Mori, Kanagawa (JP); Shigeru Kanematsu, Kanagawa (JP)

(73) Assignee: Sony Corporation, (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/100,440

(22) Filed: Apr. 7, 2005

(65) Prior Publication Data

US 2005/0202623 A1    Sep. 15, 2005

Related U.S. Application Data

(63) Continuation of application No. 10/474,125, filed on Oct. 6, 2003, now Pat. No. 6,903,424.

(30) Foreign Application Priority Data

Feb. 7, 2002    (JP) ............................. 2002-031232

(51) Int. Cl.
   *H01L 31/119* (2006.01)
(52) U.S. Cl. ................. 257/370; 438/202; 438/203
(58) Field of Classification Search ............... 257/370; 438/202
   See application file for complete search history.

(56) References Cited

U.S. PATENT DOCUMENTS

| | | | |
|---|---|---|---|
| 4,918,026 A | | 4/1990 | Kosiak et al. |
| 5,262,345 A | * | 11/1993 | Nasser et al. ............... 438/203 |
| 5,317,180 A | * | 5/1994 | Hutter et al. ............... 257/337 |
| 5,436,179 A | * | 7/1995 | Erdeljac et al. ............. 438/350 |
| 5,468,666 A | * | 11/1995 | Chapman .................... 438/226 |
| RE35,442 E | * | 2/1997 | Contiero et al. ............ 257/370 |
| 5,856,695 A | * | 1/1999 | Ito et al. .................... 257/370 |
| 5,953,600 A | * | 9/1999 | Gris ........................... 438/200 |
| 6,649,983 B1 | * | 11/2003 | Chatterjee .................. 257/370 |

FOREIGN PATENT DOCUMENTS

| | | |
|---|---|---|
| EP | 0 388 000 A2 | 9/1990 |
| JP | 62-26852 A1 | 2/1987 |
| JP | 3-201474 A1 | 9/1991 |
| JP | 6-334136 A1 | 12/1994 |
| JP | 9-199718 A1 | 7/1997 |
| JP | 11-289086 A1 | 10/1999 |
| JP | 11-330452 A1 | 11/1999 |

OTHER PUBLICATIONS

International Search Report dated May 13, 2003.

* cited by examiner

*Primary Examiner*—Asok Kumar Sarkar
(74) *Attorney, Agent, or Firm*—Rader, Fishman, Grauer PLLC; Ronald P. Kananen

(57) ABSTRACT

A semiconductor device (100) according to the present invention comprises a vertical PNP bipolar transistor (20), an NMOS transistor (50) and a PMOS transistor (60) that are of high dielectric strength, and a P-type semiconductor substrate 1, as shown in FIG. 2. A substrate isolation layer (21) of the PNP bipolar transistor (20), a drain buried layer (51) of the NMOS transistor (50), and a back gate buried layer (61) of the PMOS transistor (60) are formed simultaneously by selectively implanting N-type impurities, such as phosphorous, in the semiconductor substrate (1). This invention greatly contributes to curtailing the processes of fabricating BiCMOS ICs and the like including vertical bipolar transistors with easily controllable performance characteristics, such as a current amplification factor, and MOS transistors with high dielectric strength and makes even more miniaturization of such ICs achievable.

6 Claims, 8 Drawing Sheets

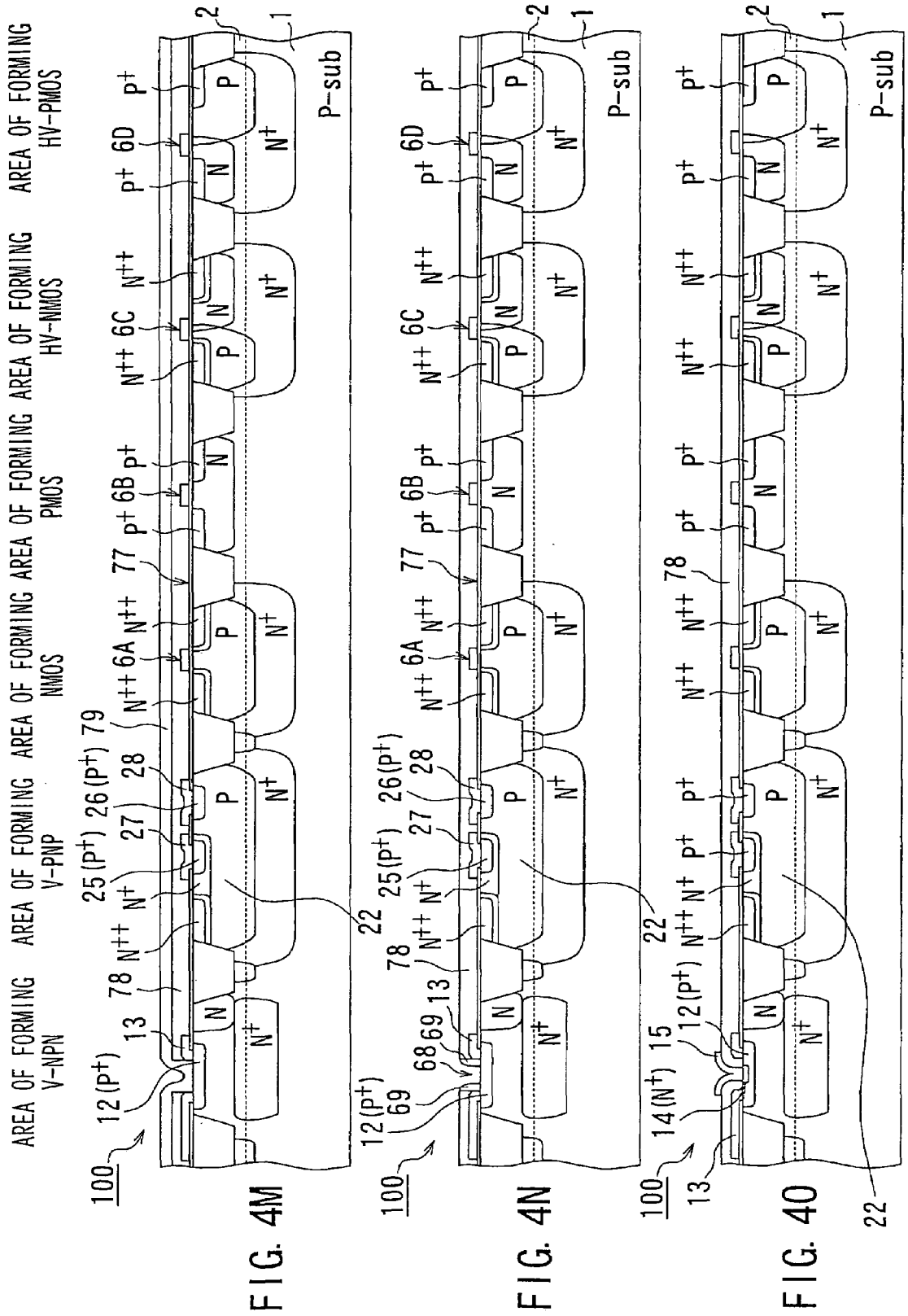

SEMICONDUCTOR DEVICE AND METHOD OF FABRICATING SAME

This is a Continuation application of application Ser. No. 10/474,125, filed Oct. 6, 2003 now U.S. Pat. No. 6,903,424, which is a naturalization of International Application No. PCT/JP03/01072, Mar. 2, 2003, the entire contents of which are hereby incorporated by reference.

TECHNICAL FIELD

This invention relates to a semiconductor device and a method of fabricating the same suitably applicable to Bipolar Complementary Metal Oxide Semiconductor (BiCMOS) type integrated circuits (ICs) that are used for dynamic range output circuits and the like in electronic circuitry to perform signal amplification and recording. Specifically, it relates to a semiconductor device and the like wherein, when forming a bipolar transistor having an emitter and a collector of one conductive type and a base of an opposite conductive type, a field effect transistor of the opposite conductive type, and a field effect transistor of the one conductive type on a first semiconductor layer of the one conductive type, a method of forming these transistors has been contrived to enable simultaneous formation of at least an interlayer isolation layer of the bipolar transistor, a drain buried layer of the field effect transistor of the opposite conductive type, and a back gate buried layer of the field effect transistor of the one conductive type. Also, the method enables to be simultaneously formed the collector of the bipolar transistor, a channel of the field effect transistor of the opposite conductive type, and a drain of the field effect transistor of the one conductive type. It also enables to be simultaneously formed a base contact region of the bipolar transistor and source and drain contact regions of the field effect transistor of the opposite conductive type.

BACKGROUND ART

So-called BiCMOS ICs which combine bipolar transistors and MOS transistors formed on the same substrate have been used lately in a variety of electronic products, utilizing features of both types of transistors, that is, high speed performance of the bipolar transistors and low power consumption of the MOS transistors. With this situation, there is a gradually increasing need for smaller, higher performance and higher reliability BiCMOS ICs.

A semiconductor device as an example of prior art BiCMOS ICs is shown in FIG. 1, where the semiconductor device 200 comprises a vertical NPN transistor 80, a lateral PNP transistor 85, an NMOS transistor 90, a PMOS transistor 95, and a semiconductor substrate 99 on which the transistors are formed. They constitute a BiCMOS IC. Hereinafter, "V-" will be referred to as "vertical" and "L-" as "lateral."

As shown in FIG. 1, this semiconductor device 200 includes a P-type silicon substrate 99. Also, the semiconductor device 200 includes an epitaxial layer 84 on the silicon substrate 99. This epitaxial layer 84 is a N-type monocrystalline silicon layer formed by epitaxial growth. An interface between the epitaxial layer 84 and the silicon substrate 99 is indicated by a dotted line in FIG. 1. In the epitaxial layer 84, element isolation regions 89 that are formed from a silicon oxide film are selectively formed. Also, under the element isolation regions 89, element isolation wells 93 that are formed from a P-type impurity diffusion layer are selectively formed at the interface between the epitaxial layer 84 and the silicon substrate 99. The above-mentioned transistors are formed in the areas confined by the element isolation regions 89 and the like.

The V-NPN transistor 80 is formed in the area confined by the element isolation regions 89 and element isolation wells 93 which are the two left ones shown in FIG. 1 on the silicon substrate 99. This V-NPN transistor 80 comprises an N-type emitter region 81, a P-type base region 82, and an N-type collector region 83. Among these regions, the collector region 83 is formed in the N-type epitaxial layer 84. The base region 82 is formed within a part of the collector region 83. The emitter region 81 also is formed within a part of the base region 82. The thickness of the base region 82 directly under the emitter region 81 is the base width of the V-NPN transistor 80. This base width of the V-NPN transistor 80 is determined by the conditions of ion implantation and thermal process that are performed when forming the base region 82 and the emitter region 81.

As shown in FIG. 1, the L-PNP transistor 85 is formed in the area adjacent to the V-NPN transistor 80 across the element isolation region 89 and element isolation well 93 on the silicon substrate 99. This L-PNP transistor 85 comprises a P-type emitter region 86, an N-type base region 87, and a P-type collector region 88. In the L-PNP transistor 85, the base region 87 consists of a part of the N-type epitaxial layer 84. The collector region 88 and the emitter region 86 are laterally disposed within parts of the base region 87. The gap distance between the emitter region 86 and the collector region 88 is the base width of the L-PNP transistor 85. This base width of the L-PNP transistor 85 is determined by the shape of a mask (resist pattern) that is used when forming the collector region 88 and the emitter region 86.

Besides, the NMOS 90 is formed in the area adjacent to the L-PNP transistor 85 across the element isolation region 89 and element isolation well 93 on the silicon substrate 99. This NMOS 90 comprises a P-type well region 92 that is formed by implanting P-type impurities into the epitaxial layer 84 and a source region 91A and a drain region 91B which are N-type and formed within parts of the P-type well region 92. Besides, the PMOS 95 is formed in the area adjacent to the NMOS 90 across the element isolation region 89 on the silicon substrate 99. This PMOS 95 comprises a well region which consists of a part of the N-type epitaxial layer 84 and a source region 96A and a drain region 96B which are P-type and formed in the epitaxial layer 84.

By the way, according to the conventional semiconductor device 200, the base width of the V-NPN transistor 80 has been determined by the conditions of ion implantation and thermal process performed when forming the base region 82 and the emitter region 81. The base width of the L-PNP transistor 85 has been determined by the shape of the mask used when forming the collector region 88 and the emitter region 86. It is more difficult to control the mask shape than to control the conditions of ion implantation and thermal process. Therefore, the base width of the L-PNP transistor 85 is harder to thin than the base width of the V-NPN transistor 80. With the evolution in miniaturization of the semiconductor device 200, a problem has arisen that a great difference occurs between the V-NPN transistor 80 and the L-PNP transistor 85 in terms of current amplification rate hFE, collector current Ic, frequency characteristic fT, and other performance parameters. Unbalance in performance characteristics between these bipolar transistors may lead to the fear of disabling the functionality of the semiconductor device 200 as the IC.

With the evolution in miniaturization of the semiconductor device 200, another problem has arisen that a hot carrier phenomenon becomes significant because of a shorter distance between the source region and the drain region in the NMOS 90 and the PMOS 95. As the hot carrier increases, the transistor lifespan is shortened significantly. A further problem has been posed with respect to the following. When electron concentration in the source region is reduced in order to enhance dielectric strength (BVds) between the source region and the drain region, thereby suppressing the above hot carrier phenomenon, resistance (Rds) between the source region and the drain region increases. With the increase in Rds, there occurs a decrease in current (Ids) flowing through the channel between the source region and the drain region.

DISCLOSURE OF THE INVENTION

A semiconductor device according to the present invention comprises a bipolar transistor having an emitter and a collector of one conductive type and a base of an opposite conductive type, a field effect transistor of the opposite conductive type, a field effect transistor of the one conductive type, and a first semiconductor layer of the one conductive type on which the transistors are formed. In this device, the bipolar transistor comprises a second semiconductor layer of the opposite conductive type, formed on the first semiconductor layer; a first impurity diffusion layer of the opposite conductive type for interlayer isolation use, formed between the second semiconductor layer and the first semiconductor layer; a second impurity diffusion layer of the one conductive type for collector use, formed in the second semiconductor layer region over the first impurity diffusion layer; a third impurity diffusion layer of the opposite conductive type for base use, formed on one side of the second impurity diffusion layer; a fourth impurity diffusion layer of the opposite conductive type for base contact use, formed on one side of the third impurity diffusion layer; a fifth impurity diffusion layer of the one conductive type for emitter use, formed on the other side of the third impurity diffusion layer; and a sixth impurity diffusion layer of the one conductive type for collector contact use, formed on the other side of the second impurity diffusion layer. The above field effect transistor of the opposite conductive type comprises a first impurity diffusion layer of the opposite conductive type for drain burying use, formed between the second semiconductor layer and the first semiconductor layer; a second impurity diffusion layer of the one conductive type for channel use, formed on one side of the second semiconductor layer region over the first impurity diffusion layer; a third impurity diffusion layer of the opposite conductive type for source use, formed in the second impurity diffusion layer; and a fourth impurity diffusion layer of the opposite conductive type for drain contact use, formed on the other side of the second semiconductor layer region. The above field effect transistor of the one conductive type comprises a first impurity diffusion layer of the opposite conductive type for back gate use, formed between the second semiconductor layer and the first semiconductor layer; a second impurity diffusion layer of the one conductive type for drain use, formed on one side of the second semiconductor layer region over the first impurity diffusion layer; a third impurity diffusion layer of the one conductive type for source use, formed on the other side of the second semiconductor layer region; and a fourth impurity diffusion layer of the one conductive type for drain contact use, formed in the second impurity diffusion layer. The first impurity diffusion layer of the bipolar transistor, the first impurity diffusion layer of the field effect transistor of the opposite conductive type, and the first impurity diffusion layer of the field effect transistor of the one conductive type are formed simultaneously by selectively implanting impurities of the opposite conductive type in the first semiconductor layer.

According to the semiconductor device of the present invention, the invention would make a great contribution to curtailing the processes of fabricating the semiconductor device, including both the vertical bipolar transistor with easily controllable performance characteristics, such as a current amplification factor, and the field effect transistors with high dielectric strength. By virtue of that, the field effect transistor of the opposite conductive type has a structure in which the source and drain contact regions overlap, an electric field at and near the interface between the drain and channel can be moderated and hot carrier occurrence can be suppressed.

A method of fabricating a semiconductor device according to the present invention is the method wherein a bipolar transistor having an emitter and a collector of one conductive type and a base of an opposite conductive type, a field effect transistor of the opposite conductive type, and a field effect transistor of the one conductive type are formed on a first semiconductor layer of the one conductive type. The present method comprises a step of confining in advance a first area of forming the bipolar transistor, a second area of forming the field effect transistor of the opposite conductive type, and a third area of forming the field effect transistor of the one conductive type, respectively, on the first semiconductor layer, a step of forming a first impurity diffusion layer for interlayer isolation use, a first impurity diffusion layer for drain burying use, and a first impurity diffusion layer for back gate use by implanting impurities of the opposite conductive type in the first semiconductor layer in the first, second, and third areas, respectively, a step of forming a second semiconductor layer of the opposite conductive type on the first semiconductor layer in which the first impurity diffusion layers have been formed in the first, second, and third areas, respectively; a step of forming a second impurity diffusion layer for collector use, a second impurity diffusion layer for channel use, and a second impurity diffusion layer for drain use by implanting impurities of the one conductive type into the second semiconductor layer in the first area, a predetermined portion of said second area, and a predetermined portion of said third area, respectively; a step of growing an insulative film and a conductive film on the second impurity diffusion layer in the second area and on the second semiconductor layer in the third area, shaping the insulative film and the conductive film into predetermined forms, and thus forming a first electrode and a second electrode for gate use, respectively; a step of forming a third impurity diffusion layer for base use by implanting impurities of the opposite conductive type into a predetermined portion of the second impurity diffusion layer in the first area; a step of forming a fourth impurity diffusion layer for base contact use, a third impurity diffusion layer for source use, and a fourth impurity diffusion layer for drain contact use by implanting impurities of the opposite conductive type into a predetermined portion of the third impurity diffusion layer in the first area, the second impurity diffusion layer exposed out of the first electrode in the second area, and a predetermined portion of the second semiconductor layer in the second area, respectively; a step of forming a third impurity diffusion layer for source use and a fourth impurity diffusion layer for drain contact use by implanting impurities of the one conductive type into the second semiconductor layer exposed out of the second electrode in the third area and a predetermined portion of the second impurity diffusion layer in the third area, respectively; and a step of forming a fifth impurity diffusion layer for emitter use and a sixth impurity diffusion layer for collector contact use by implanting impurities of the one conductive type into a predetermined portion of the third impurity diffusion layer in the first area and a predetermined portion of the second impurity diffusion layer in the first area, respectively.

According to the method of fabricating a semiconductor device of the present invention, the interlayer isolation layer of the bipolar transistor, the drain buried layer of the field effect transistor of the opposite conductive type, and the back gate buried layer of the field effect transistor of the one conductive type can be formed simultaneously. Also, in this method, after forming the second semiconductor layer of the opposite conductive type on the first semiconductor layer, the second impurity diffusion layer for collector use, the second impurity diffusion layer for channel use, and the second impurity diffusion layer for drain use are formed by implanting impurities of the one conductive type into the second semiconductor layer in the first area, a predetermined portion of the second area, and a predetermined portion of the third area, respectively. Thus, the collector of the bipolar transistor, the channel of the field effect transistor of the opposite conductive type, and the drain of the field effect transistor of the one conductive type can be formed simultaneously.

Moreover, in this method, the first electrode and second electrode for gate use are formed on the second impurity diffusion layer in the second area and on the second semiconductor layer in the third area, respectively, and the third impurity diffusion layer for base use of the opposite conductive type is formed in the predetermined portion of second impurity diffusion layer in the first area, and, then, the fourth impurity diffusion layer for base contact use, the third impurity diffusion layer for source use, and the fourth impurity diffusion layer for drain contact use are formed by implanting impurities of the opposite conductive type into the predetermined portion of the third impurity diffusion layer in the first area, the second impurity diffusion layer exposed out of the first electrode in the second area, and the predetermined portion of the second semiconductor layer in the second area, respectively. Thus, the base contact region of the bipolar transistor and the source and drain contact regions of the field effect transistor of the opposite conductive type can be formed simultaneously. In addition, the semiconductor device including both vertical bipolar transistors with easily controllable performance characteristics, such as the current amplification factor, and field effect transistors with high dielectric strength can be fabricated through a reduced number of processes. Through this effect, the invention would make even more miniaturization of semiconductor devices, such as BiCMOS, achievable.

BRIEF DESCRIPTION OF THE DRAWINGS

FIGS. 4A through 4O are process diagrams illustrating an example of fabricating the semiconductor device 100 wherein:

FIG. 4A is a cross-sectional diagram depicting an example of implanting N-type impurity ions in a P-type semiconductor substrate 1;

FIG. 4M is a cross-sectional diagram depicting an example of growing an insulation film over the semiconductor substrate 1;

FIG. 4N is a cross-sectional diagram depicting an example of forming side walls on the semiconductor substrate 1; and FIG. 4O is a cross-sectional diagram depicting an example of forming an emitter contact electrode.

BEST MODE FOR CARRYING OUT THE INVENTION

This invention resolves the problems associated with the conventional semiconductor devices, and its object is to provide a semiconductor device and a method of fabricating the same, which are designed to enable the fabrication of a BiCMOS IC comprising both of vertical bipolar transistors with easily controllable performance characteristics, such as the current amplification factor, and field effect transistors with high dielectric strength through a reduced number of fabrication processes and to make even more miniaturization of this type of IC achievable.

Figure 1:
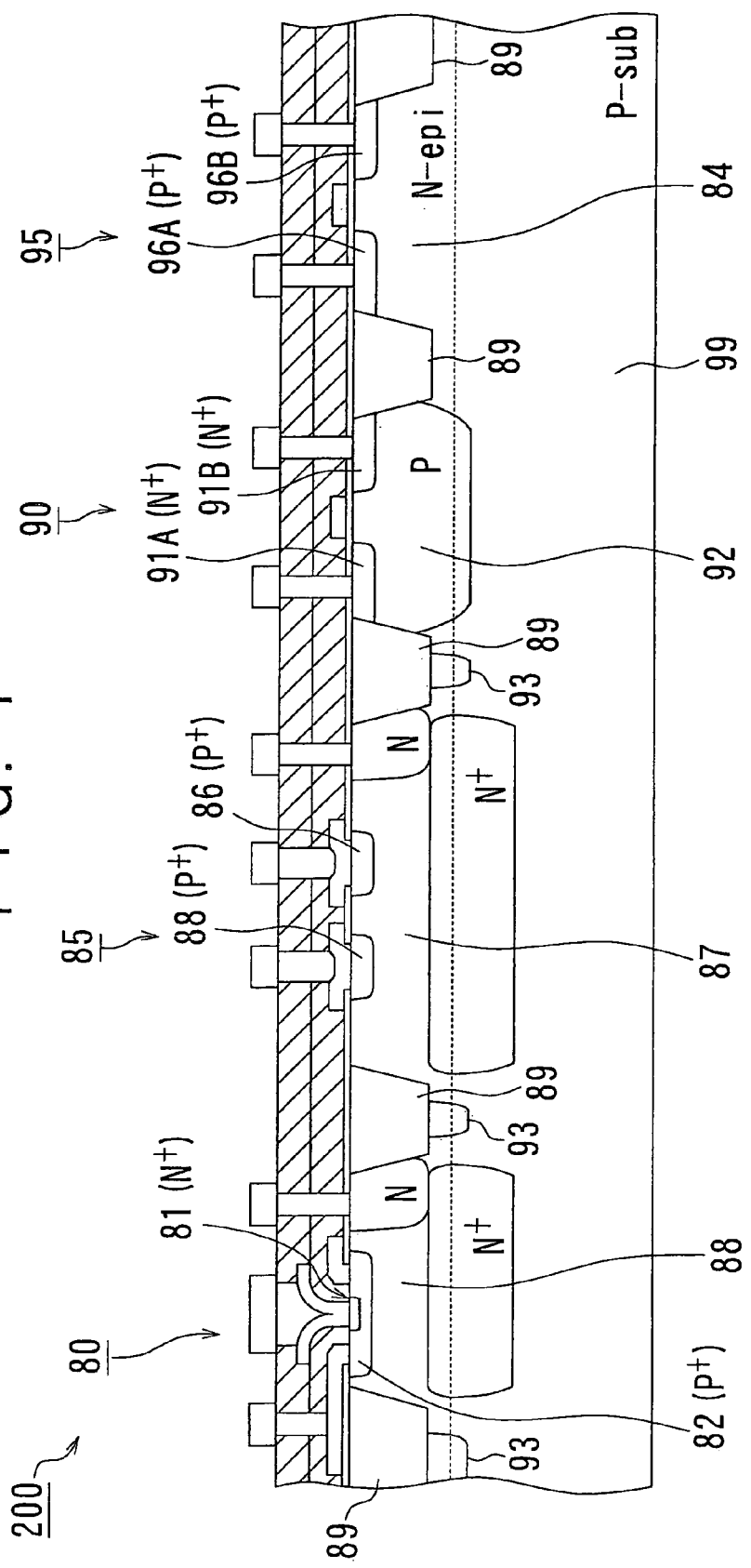
FIG. 1 is a cross-sectional diagram showing an exemplary structure of a conventional semiconductor device 200.
Figure 2:
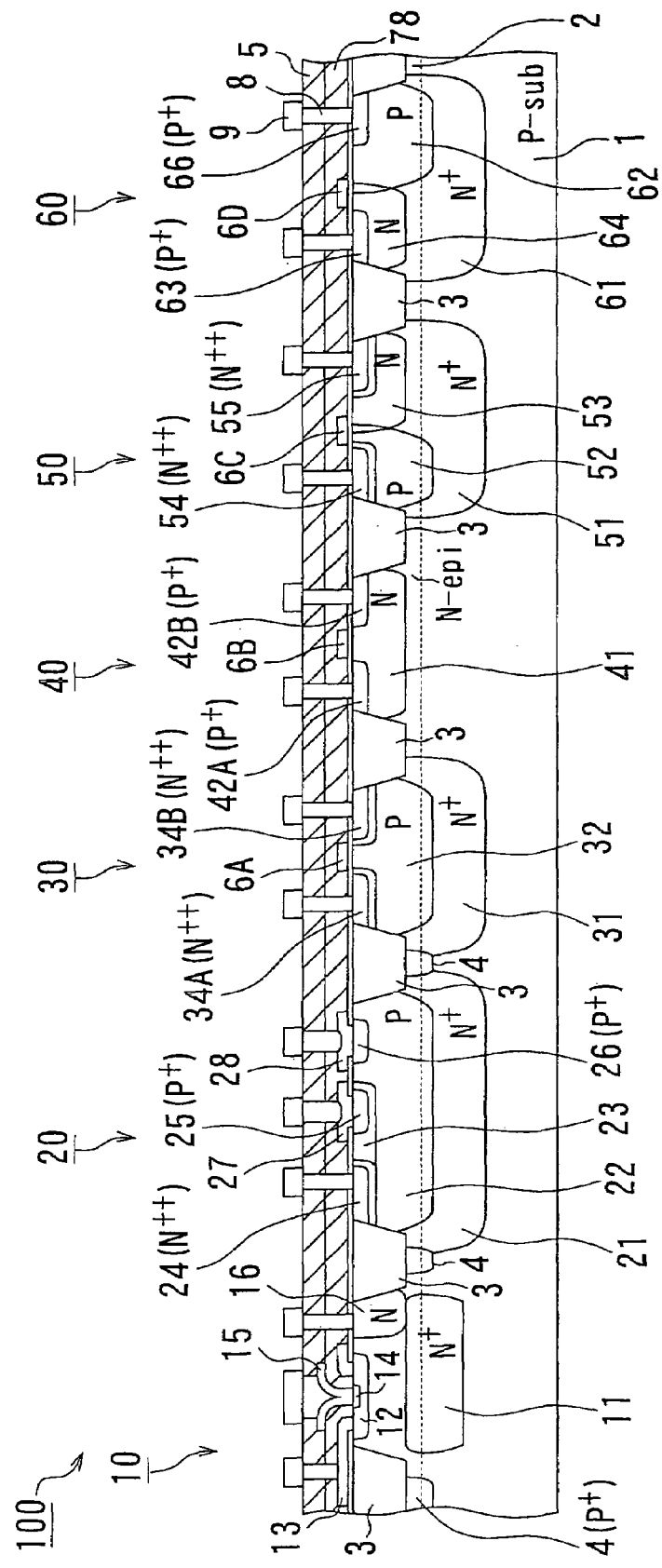
FIG. 2 is a cross-sectional diagram showing an exemplary structure of a semiconductor device 100 according to an illustrative embodiment of the present invention.

A semiconductor device and a method of fabricating the same according to an illustrative embodiment of this invention will be described hereinafter with reference to the accompanying drawings. FIG. 2 is a cross-sectional diagram showing an exemplary structure of a semiconductor device 100 according to the illustrative embodiment of the present invention.

In this embodiment, when forming a bipolar transistor having an emitter and a collector of one conductive type and a base of an opposite conductive type, a field effect transistor of the opposite conductive type, and a field effect transistor of the one conductive type on the first semiconductor layer of the one conductive type, a method of forming these transistors has been contrived to enable simultaneous formation of the interlayer isolation layer of the bipolar transistor, the drain buried layer of the field effect transistor of the opposite conductive type, and the back gate buried layer of the field effect transistor of the one conductive type, simultaneous formation of the collector of the bipolar transistor, the channel of the field effect transistor of the opposite conductive type, and the drain of the field effect transistor of the one conductive type, and simultaneous formation of the base contact region of the bipolar transistor and the source and drain contact regions of the field effect transistor of the opposite conductive type.

(1) Semiconductor Device

The semiconductor device 100 shown in FIG. 2 constitutes a BiCMOS IC. This semiconductor device 100 comprises, from the left hand of FIG. 2, a V-NPN bipolar transistor (hereinafter also referred to as V-NPN) 10, a V-PNP bipolar transistor (hereinafter also referred to as V-PNP) 20, which is an example of the bipolar transistor including the emitter and collector of the one conductive type and the base of the opposite conductive type, an N-type MOS field effect transistor (hereinafter also referred to as NMOS) 30, a P-type MOS field effect transistor (hereinafter also referred to as PMOS) 40, an N-type MOS field effect transistor of high dielectric strength (hereinafter also referred to as HV-NMOS) 50, which is an example of the field effect transistor of the opposite conductive type, and a P-type MOS field effect transistor of high dielectric strength (hereinafter also referred to as HV-PMOS) 60, which is an example of the field effect transistor of the one conductive type, the transistors being formed on the same semiconductor substrate.

This semiconductor device 100 includes a P-type semiconductor substrate 1 as an example of the first semiconductor layer of the one conductive type. This semiconductor substrate 1 is, for example, a monocrystalline silicon substrate including boron. On the semiconductor substrate 1, an N-type epitaxial layer 2 is formed as an example of the second semiconductor layer. This N-type epitaxial layer 2 is made of, for example, monocrystalline silicon including phosphorous. The thickness of the epitaxial layer 2 is in the order of 0.5 to 2.0 $\mu$m. The dotted line shown in FIG. 2 indicates an interface between the epitaxial layer 2 and the semiconductor substrate 1. In the epitaxial layer 2, silicon oxide film regions for element isolation (hereinafter also referred to as element isolation regions) 3 are selectively formed. Besides, under the element isolation regions 3, wells for element isolation formed from a P-type impurity diffusion layer (hereinafter also referred to as element isolation wells) 4 are selectively formed along the interface between the epitaxial layer 2 and the semiconductor substrate 1.

On the semiconductor substrate 1, in the element areas confined by these element isolation regions 3 and the like, each of the above-mentioned transistors is formed. For example, the V-NPN 10 is formed in an area confined by the element isolation regions 3 and element isolation wells 4 on the semiconductor substrate 1, as shown in the left side in FIG. 2.

The V-NPN 10 shown in FIG. 2 includes an N-type collector buried layer 11 between the epitaxial layer 2 and the P-type semiconductor substrate 1. The collector buried layer 11 is formed to reduce collector resistance of the V-NPN 10. In the V-NPN 10, a region of the N-type epitaxial layer 2 is designed to function as the collector. Besides, the V-NPN 10 includes a P-type base region 12 in the top left portion of the epitaxial layer 2, as shown in FIG. 2. On the top of this base region 12, a base contact electrode 13 is formed to draw the base up from the epitaxial layer 2. In a center of the base region 12, an N-type emitter region 14 is formed. On the N-type emitter region 14, an emitter contact electrode 15 is also formed to draw the emitter up from the epitaxial layer 2. Besides, the V-NPN 10 includes an N-type collector contact region 16 in the top right portion of the epitaxial layer 2, as shown in FIG. 2. This collector contact region 16 is formed from an N-type impurity diffusion layer to lead the collector current to a plug electrode above the epitaxial layer 2. The collector contact region 16 is formed to touch the N-type collector buried layer 11.

As shown in FIG. 2, the V-PNP 20 is formed in the area at the right, next to the V-NPN 10 across the element isolation region 3 and element isolation well 4 on the semiconductor substrate 1. This V-PNP 20 includes an N-type substrate isolation layer 21 as an example of the first impurity diffusion layer of the opposite conductive type for interlayer isolation use. This N-type substrate isolation layer 21 is formed with it being buried between the semiconductor substrate 1 and the epitaxial layer 2. This substrate isolation layer 21 allows the V-PNP 20 to be isolated from the potential of the semiconductor substrate 1.

The V-PNP 20 includes a P-type collector region 22 as an example of the second impurity diffusion layer of the one conductive type. Implanting P-type impurities into the epitaxial layer 2 over the substrate isolation layer 21 allows this collector region 22 to be formed. As shown in FIG. 2, the collector region 22 extends from the top of the epitaxial layer 2 down to and beyond the interface between the epitaxial layer 2 and the semiconductor substrate 1. The V-PNP 20 includes an N-type base region 23 as an example of the third impurity diffusion layer of the opposite conductive type for base use. As shown in FIG. 2, this base region 23 is formed in the top left portion of the collector region 22.

Besides, the V-PNP 20 includes an N-type base contact region 24 as an example of the fourth impurity diffusion layer of the opposite conductive type for base contact use. This N-type base contact region 24 is formed at the left side in the base region 23, as shown in FIG. 2. The V-PNP 20 includes a P-type emitter region 25 as an example of the fifth impurity diffusion layer of the one conductive type for emitter use. This emitter region 25 is formed at the right side in the base region 23, as shown in FIG. 2. The emitter region 25 is formed with a predetermined gap distance from the base contact region 24. On the top of the emitter region 25, an emitter electrode 27 is formed. This emitter electrode 27 is made of, for example, polycrystalline silicon including P-type impurities. Moreover, the V-PNP 20 includes a P-type collector contact region 26 as an example of the sixth impurity diffusion layer of the one conductive type for collector contact use. This P-type collector contact region 26 is formed in the top right portion of the P-type collector region 22, as shown in FIG. 2. On the top of the collector contact region 26, a collector electrode 28 is formed. This collector electrode 28 is made of, for example, P-type polycrystalline silicon, which is the same as for the emitter electrode 27.

Additionally, the V-PNP 20 has a vertical structure in which the emitter region 25, the base region 23, and the collector region 22 are disposed vertically. Thus, because the base width can be determined by impurity diffusion, not photolithography, precise base width control can be performed. Accordingly, if this semiconductor device 100 is more miniaturized, the performance characteristics, such as the current amplification factor hFE, and frequency characteristic fT of the V-PNP 20 can be enhanced reliably well, as in the case of the V-NPN 10. In other words, if this semiconductor device 100 is even more miniaturized, the transistor performance characteristics of the V-NPN 10 and V-PNP 20 can be enhanced while being well balanced.

As shown in FIG. 2, the NMOS 30 is formed in an area at the right, next to the V-PNP 20 across the element isolation region 3 and element isolation well 4 on the semiconductor substrate 1. The NMOS 30 includes a P-type well region 32 formed in the epitaxial layer 2 on the semiconductor substrate 1. Also, the NMOS 30 includes an N-type substrate isolation layer 31 between the P-type well region 32 and the P-type semiconductor substrate 1. This substrate isolation layer 31 allows the NMOS 30 to be isolated from the potential of the semiconductor substrate 1. This NMOS 30 includes an N-type source region 34A in the top left portion of the well region 32 shown in FIG. 2 and an N-type drain region 34B in the top right portion of the well region 32. Both the source region 34A and the drain region 34B have an equal impurity concentration and a Double Diffused Drain (DDD) structure. By this DDD structure, an electric field at and near the interface between the well region 32 and the drain region 34B can be decreased and hot carrier occurrence can be suppressed.

Besides, the NMOS 30 includes a gate oxide film (not shown) on the top of the well region 32 between the source region 34A and the drain region 34B and a gate electrode 6A on the top of the gate oxide film. As shown in FIG. 2, the PMOS 40 is formed in an area at the right, next to the NMOS 30 across the element isolation region 3 on the semiconductor substrate 1. The PMOS 40 includes an N-type well region 41 formed in the epitaxial layer 2 on the semiconductor substrate 1. This N-well region 41 is formed by implanting N-type impurities into the epitaxial layer 2. The PMOS 40 includes a source region 42A and a drain region 42B, both of P type, within the N-well region 41. Besides, on the top of the N-well region 41 between these source region 42A and drain region 42B, a gate oxide film (not shown) and a gate electrode 6B are formed.

As shown in FIG. 2, the HV-NMOS 50 is formed in an area at the right, next to the PMOS 40 across the element isolation region 3 on the semiconductor substrate 1. This HV-NMOS 50 includes a drain buried layer 51 as an example of the first impurity diffusion layer of the opposite conductive type for drain burying use. This drain buried layer 51 is formed between the P-type semiconductor substrate 1 and the epitaxial layer 2. The HV-NMOS 50 includes a P-type channel region 52 as an example of the second impurity diffusion layer of the one conductive type for channel use. This P-type channel region 52 is formed by implanting P-type impurities into the epitaxial layer 2 over the drain buried layer 51. As shown in FIG. 2, this channel region 52 extends from the top left of the epitaxial layer 2 down to and beyond the interface between the epitaxial layer 2 and the semiconductor substrate 1.

Besides, the HV-NMOS 50 includes an N-type drain region 53 as an example of the fifth impurity diffusion layer for drain use in the top right portion of the epitaxial layer 2 on the drain buried layer 51 shown in FIG. 2. The N-type impurity concentration in the N-type drain region 53 is made lower than that in the drain buried layer 51. The HV-NMOS 50 includes an N-type source region 54 as an example of the third impurity diffusion layer of the opposite conductive type for source use. As shown in FIG. 2, this source region 54 is formed in the top left portion of the channel region 52. The source region 54 has the DDD structure that can suppress hot carrier occurrence.

Besides, the HV-NMOS 50 includes an N-type drain contact region 55 as an example of the fourth impurity diffusion layer of the opposite conductive type for drain contact use. This drain contact region 55 is formed in the top right portion of the drain region 53 shown in FIG. 2. The N-type impurity concentration in the drain contact region 55 is made higher than the impurity concentration in the drain region 53. The drain contact region 55 also has the DDD structure. Moreover, the HV-NMOS 50 includes a gate oxide film (not shown) and a gate electrode 6C on the top of the channel region 52 and the drain region 53.

Figure 3:
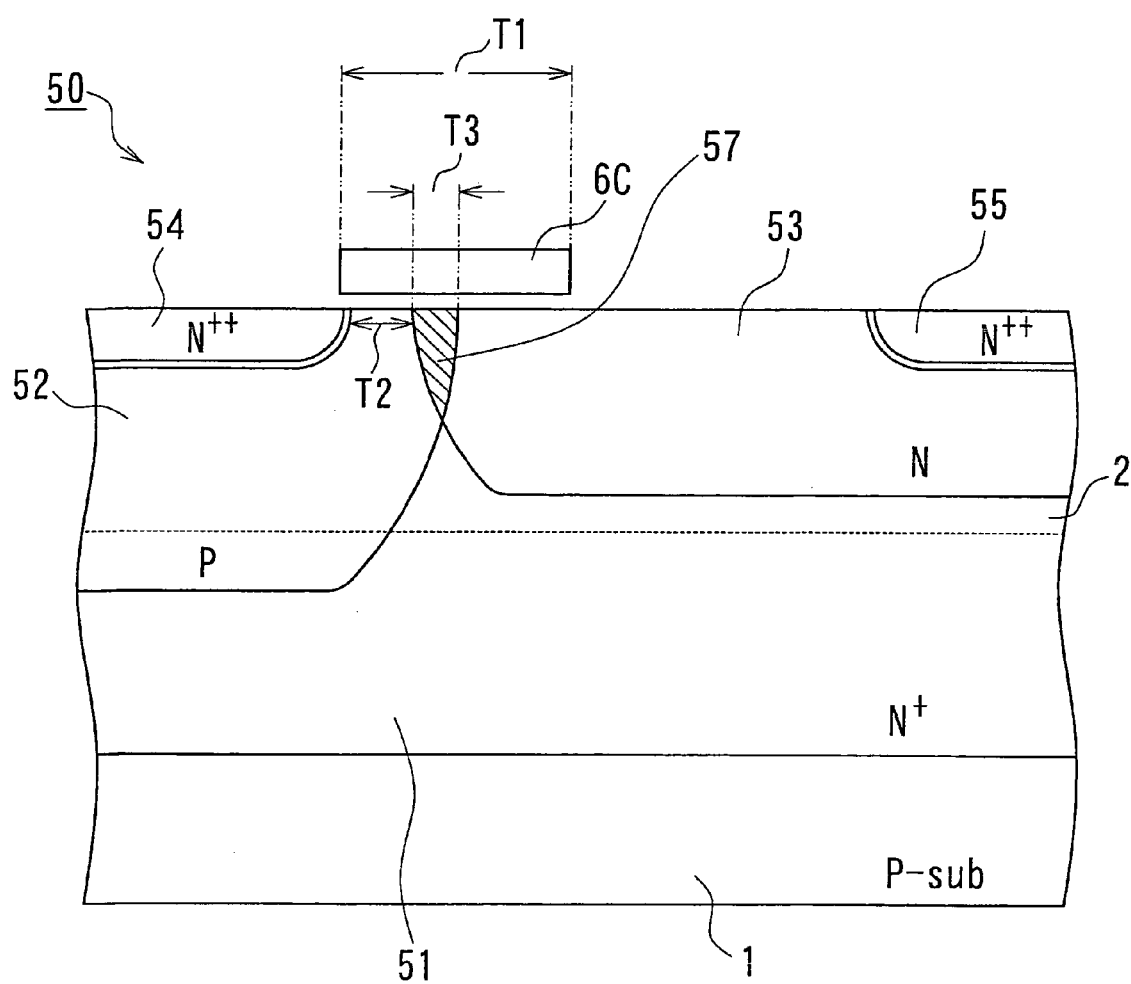
FIG. 3 is a cross-sectional diagram showing an exemplary structure of an HV-NMOS 50.

By the way, as is shown in FIG. 3, the HV-NMOS 50 is constructed such that the top right end of the channel region 52 and the top left end of the drain region 53 overlap directly under the gate electrode 6C. This allows the surface concentration of impurities in the epitaxial layer 2 directly under the gate electrode 6C to be adjusted, thereby reducing the variation in threshold voltage Vth. In FIG. 3, the length of the gate electrode 6C, which is represented by T1, is, for example, T1=about 4 $\mu$m. The distance between the region where the well region 52 and the drain region 53 overlap (hereinafter also referred to as the overlap region) 57 and the source region 54, which is represented by T2, is T2=about 1 $\mu$m. The length of the overlap region 57, which is represented by T3, is, for example, T3=about 0.8 (m. In the HV-NMOS 50, beneath the channel region 52, there is the drain buried layer 51 with a higher N-type impurity concentration than the drain region 53. This allows the dielectric strength (BVds) between the source and drain of the HV-NMOS 50 to be enhanced and the resistance (Rds) between the source and drain to be reduced. A decrease in current (Ids) flowing through the channel between the source region and the drain region can be suppressed. It should be noted that the N-type impurity concentration in the drain region 53 of the HV-NMOS 50 is made lower than the impurity concentration in the drain contact region 55. Consequently, hot carrier occurrence can be suppressed even if the DDD structure is not used for the drain contact region 55.

Furthermore, as shown in FIG. 2, the HV-PMOS 60 is formed in an area at the right, next to the HV-NMOS 50 across the element isolation region 3 on the semiconductor substrate 1. The HV-PMOS 60 includes an N-type back gate buried layer 61 as an example of the first impurity diffusion layer of the opposite conductive type for back gate use. This back gate buried layer 61 is formed with it being buried between the P-type semiconductor substrate 1 and the epitaxial layer 2. The HV-PMOS 60 includes a P-type drain region 62 as an example of the second impurity diffusion layer of the one conductive type for drain use. This P-type drain region 62 is formed by implanting P-type impurities into the epitaxial layer 2 over the N-type back gate buried layer 61. As shown in FIG. 2, this drain region 62 extends from the top right of the epitaxial layer 2 down to and beyond the interface between the epitaxial layer 2 and the semiconductor substrate 1.

Besides, the HV-PMOS 60 includes an N-type channel region 64 as an example of the fifth impurity diffusion layer for channel use in the top left side of the epitaxial layer 2 region over the back gate buried layer 61. The HV-PMOS 60 also includes a P-type source region 63 as an example of the third impurity diffusion layer of the one conductive type for source use in the top left side of the N-type channel region 64. The HV-PMOS 60 also includes a P-type drain contact region 66 as an example of the fourth impurity diffusion layer of the one conductive type for drain contact use at the top right of the source region 63 shown in FIG. 2. Moreover, the HV-PMOS 60 includes a gate oxide film (not shown) and a gate electrode 6D on the top of the channel region 64 and the drain region 62.

By the way, as is shown in FIG. 2, the HV-PMOS 60 is constructed such that the top right end of the channel region 64 and the top left end of the drain region 62 overlap directly under the gate electrode 6D. As is the case for the HV-NMOS 50, this allows the variation in the threshold voltage Vth of the HV-PMOS 60 to be reduced. In the HV-PMOS 60, the drain region 62 is formed deep, extending from the top right of the epitaxial layer 2 down to the semiconductor substrate 1, and beneath the drain region 62, there is the back gate buried layer 61 with a higher N-type impurity concentration than the channel region 64. This allows the dielectric strength between the source and drain of the HV-PMOS 60 to be enhanced, thereby reducing the resistance (Rds) between the source and drain.

As shown in FIG. 2, on the above-described transistors, a first interlayer insulation film 78 and a second interlayer insulation film 5 are layered. In the NPN transistor 10 and the PNP transistor 20, the interlayer insulation films 78 and 5 have holes just above the emitters, bases and collectors of these transistors, and via plugs 8 are installed in these holes. Similarly, in the NMOS 30, PMOS 40, HV-NMOS 50, and HV-PMOS 60, via plugs 8 are installed in the holes just above the sources and drains of these transistors. On these via plugs, a wiring pattern 9 made of Al and other suitable material is formed.

By the way, in the semiconductor device 100, the substrate isolation layer 21 of the V-PNP 20, the drain buried layer 51 of the HV-NMOS 50, and the back gate buried layer 61 of the HV-PMOS 60 are simultaneously formed by implanting N-type impurities, such as phosphorous, selectively into the N-type epitaxial layer 2. Thus, this greatly contributes to curtailing the processes of fabricating the semiconductor device 10 including the V-PNP 20 with easily controllable performance characteristics, such as the current amplification factor, and the HV-NMOS 50 and HV-PMOS 60, which are of high dielectric strength.

(2) Method of Fabricating the Semiconductor Device

Figure 4A:
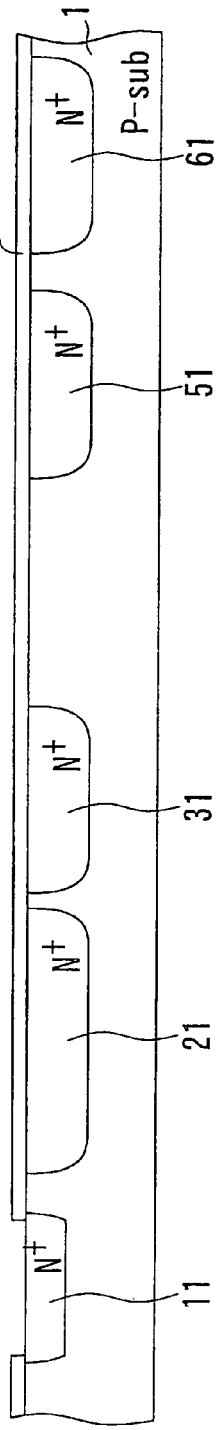

Next, referring to FIGS. 4A through 40, the method of fabricating the semiconductor device 100 will be described. In this embodiment, it is assumed that the semiconductor device 100 shown in FIG. 2 is constructed through an elaborated method of N-type impurity ion implantation. First, the P-type semiconductor substrate 1 as shown in FIG. 4A is prepared. Then, a silicon oxide film (thermal oxide film) 71 in the order of 100 to 500 nm thick is grown on the main surface of the semiconductor substrate 1. A mask pattern (not shown) is formed on the silicon oxide film 71 to open only areas where the V-PNP will be formed (hereinafter also referred to as the area of forming V-PNP), where the NMOS will be formed (hereinafter also referred to as the area of forming NMOS), where the HV-NMOS will be formed (hereinafter also referred to as the area of forming HV-NMOS), and where the HV-PMOS will be formed (hereinafter also referred to as the area of forming HV-PMOS). This mask pattern is, for example, a resist pattern formed by a well-known photolithography technique. Next, N-type impurity ions are implanted into the semiconductor substrate 1 with the mask pattern formed thereon. The conditions of this ion implantation are, for example, ions of Phos (phosphorous), implantation energy of 200 to 500 keV, and dose of the order of 1E12 to 1E14/cm². After the ion implantation, the mask pattern is removed through a well-known ashing technique.

Then, a new mask pattern (not shown) is formed to open only the area where the V-NPN will be formed (hereinafter also referred to as the area of forming V-NPN), and the silicon oxide film 71 only in this area of forming V-NPN is removed. After removing the mask pattern, for example, through an Sb (antimony as N-type impurities) solid-phase diffusion process, the N-type collector buried layer 11 is formed in the area of forming the V-NPN on the semiconductor substrate 1. At the same time, the phosphorous ions already implanted in the semiconductor substrate 1 are diffused by the heat generated by this Sb solid-phase diffusion process. As a result, the substrate isolation layers 21 and 31, drain buried layer 51, and back gate buried layer 61, as well as the collector buried layer 11, can be formed simultaneously, as shown in FIG. 4A. The method of forming the collector buried layer 51 is not restricted to the solid-phase diffusion process, and other methods such as, for example, impurity ion implantation may be applied.

Figure 4B:
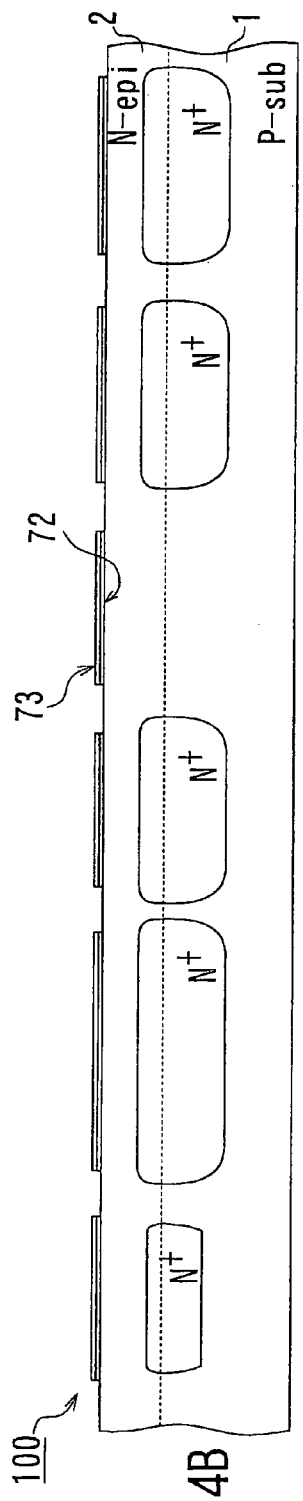
FIG. 4B is a cross-sectional diagram depicting an example of forming an N-type epitaxial layer in the semiconductor substrate 1.

Next, all the silicon oxide film 71 on the semiconductor substrate 1 is removed by wet etching or the like. Then, as is shown in FIG. 4B, the epitaxial layer 2 in the order of 0.5 to 2.0 μm thick is grown on the semiconductor substrate 1. When the epitaxial layer 2 is grown (through epitaxial growth), the semiconductor substrate 1 is heated up to about 1000° C. In consequence, the collector buried layer 11, substrate isolation layers 21 and 31, drain buried layer 51, and back gate buried layer 61 formed on the semiconductor substrate 1 are diffused into the internal portions of the epitaxial layer 2.

Next, a silicon oxide film 72 in the order of 10 to 100 nm thick is grown on the epitaxial layer 2, as shown in FIG. 4B. Besides, a silicon nitride film 73 in the order of 20 to 100 nm thick is grown on the silicon oxide film 72. Then, a mask pattern (not shown) is formed on the silicon nitride film 73 to cover the area of forming V-NPN, the area of forming V-PNP, the area of forming NMOS, the area where the PMOS will be formed (hereinafter also referred to as the area of forming PMOS), the area of forming HV-NMOS, and the area of forming HV-PMOS, and the silicon nitride film 73 exposed out of this mask pattern is removed.

Next, this mask pattern is removed and the semiconductor substrate 1 from which the silicon nitride film 73 has been selectively removed is thermally oxidized. As a result, an element isolation film (silicon oxide film) in the order of 100 to 1000 nm thick is grown on the epitaxial layer 2. At this time, in the surface portions where the silicon nitride film 73 has been removed, except for the areas of forming the above-mentioned transistors, the undercoat silicon oxide film 3 may be removed and the exposed surface of the semiconductor substrate 1 may be recessed. The process for growing the element isolation film is not restricted to thermal oxidation of the semiconductor substrate 1. Other processes such as, for example, Chemical Vapor Deposition (CVD), may be applied to grow the element isolation film.

Figure 4C:
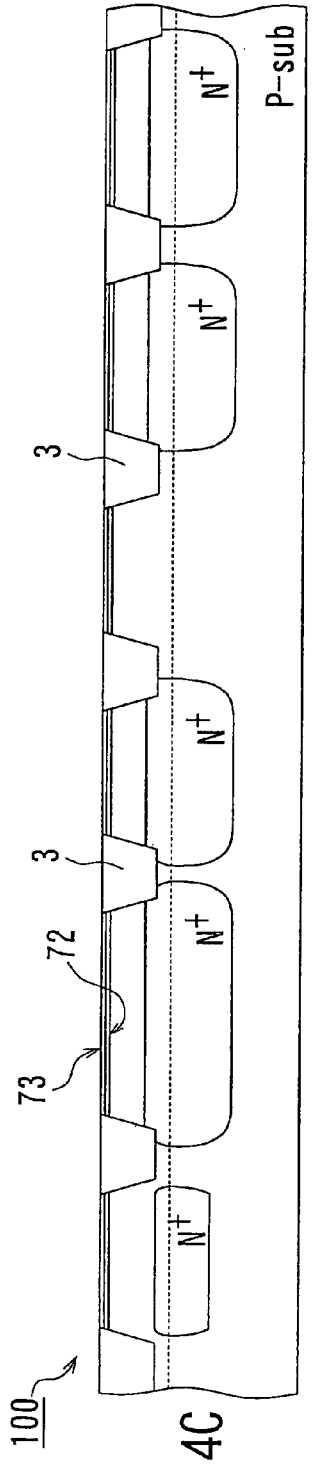
FIG. 4C is a cross-sectional diagram depicting an example of an etching back process in the semiconductor substrate 1.
Figure 4D:
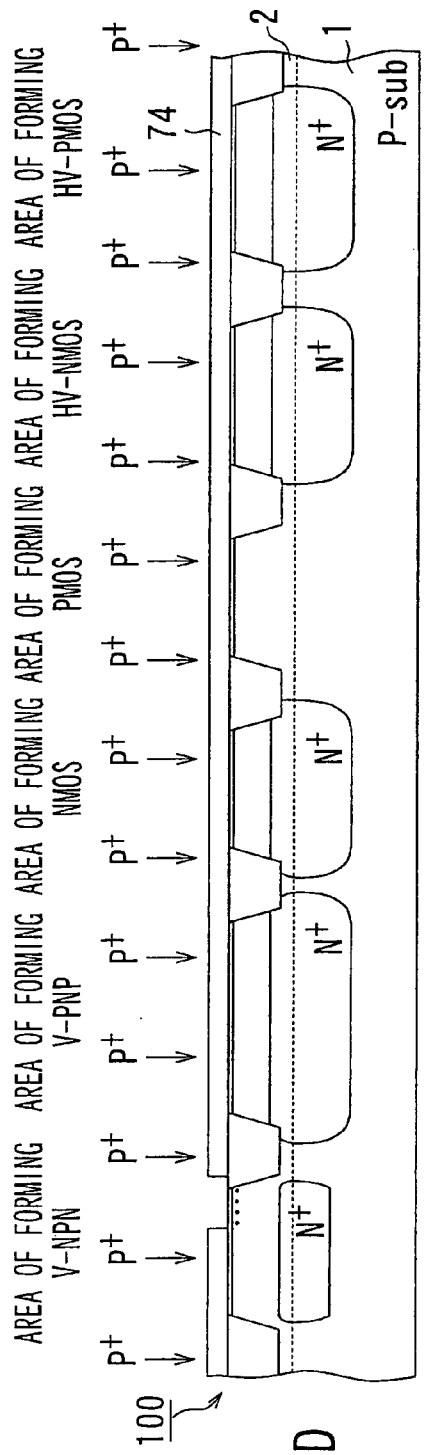
FIG. 4D is a cross-sectional diagram depicting an example of implanting phosphorous ions in the semiconductor substrate 1.

Next, as is shown in FIG. 4C, by etching back all the top of the semiconductor substrate 1, the patterned indented surface due to the element isolation regions 3 is planarized. After this planarization is performed, the silicon nitride film 73 on the areas of forming the transistors is removed. After the removal of the silicon nitride film 73, as is shown in FIG. 4D, a mask pattern 74 is formed on the epitaxial layer 2 to selectively open only the collector contact region 16 (see FIG. 2). Then, N-type impurity ions are implanted into the epitaxial layer 2 on which the mask pattern 74 has been formed. Conditions of this ion implantation are, for example, ions of phosphorous, implantation energy of 50 to 100 keV, and dose of the order of 1E15 to 1E16/cm². After the ion implantation, the mask pattern 74 is removed.

Figure 4E:
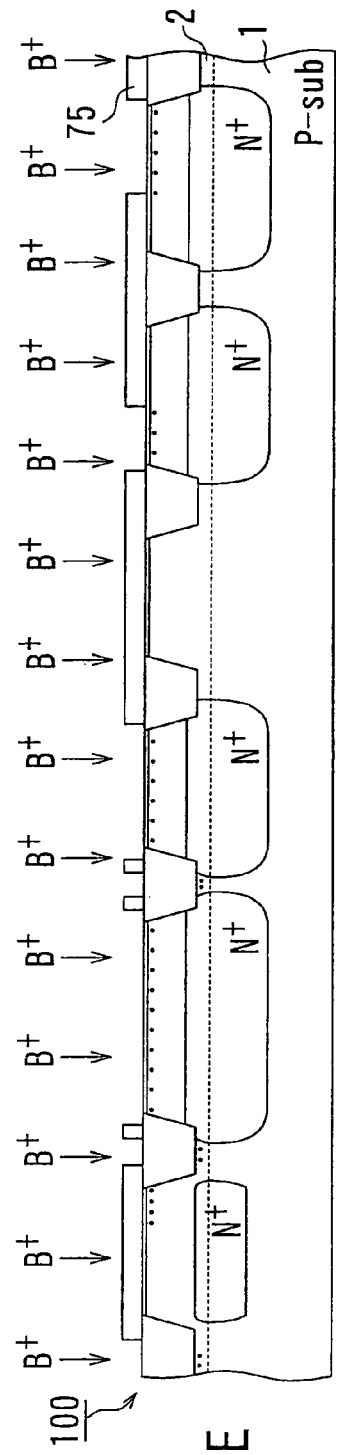
FIG. 4E is a cross-sectional diagram depicting an example of implanting boron ions in the semiconductor substrate 1.

Besides, as is shown in FIG. 4E, a mask pattern 75 is formed on the epitaxial layer 2 to selectively open only the area of forming V-PNP, the area of forming NMOS, the left-hand portion of the area of forming HV-NMOS, the right-hand portion of the area of forming HV-PMOS, and some of the element isolation regions 3. At this time, through a photolithography exposure process or the like, the shape of the mask pattern 75 is tailored so that the top right end of the channel region 52 (see FIG. 2) can be positioned directly under the gate electrode 6C (see FIG. 2) and the top left end of the drain region 62 (see FIG. 2) can be positioned directly under the gate electrode 6D (see FIG. 2). Then, P-type impurity ions are implanted into the epitaxial layer 2 on which the mask pattern 75 has been formed. Conditions of this ion implantation are, for example, ions of boron, implantation energy of 200 to 400 keV, and dose of the order of 1E13 to 1E16/cm². After the ion implantation, the mask pattern 75 is removed.

Figure 4F:
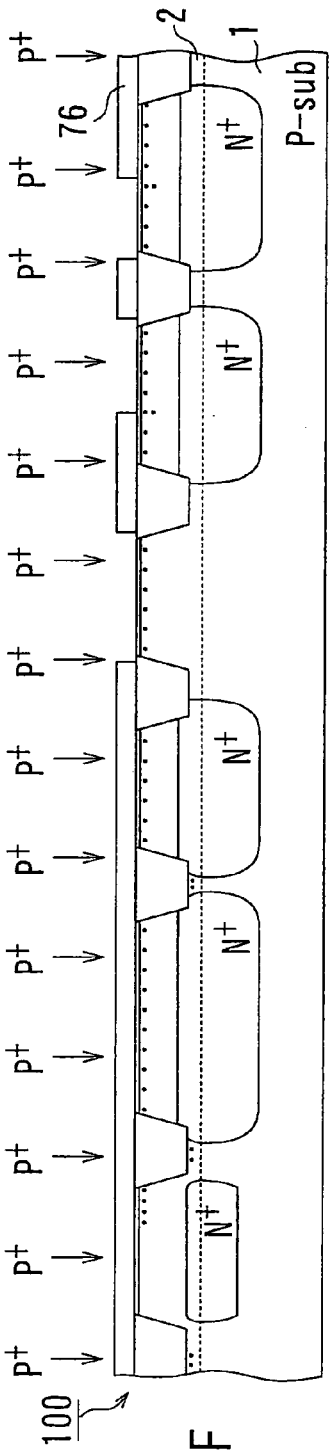
FIG. 4F is a cross-sectional diagram depicting an example of implanting phosphorous ions in the semiconductor substrate 1.

Next, as is shown in FIG. 4F, a mask pattern 76 is formed on the epitaxial layer 2 to open only the area of forming PMOS, the right half of the area of forming HV-NMOS, and the left half of the area of forming HV-PMOS. At this time, the shape of the mask pattern 76 is tailored so that the top left end of the drain region 53 (see FIG. 2) can be positioned directly under the gate electrode 6C (see FIG. 2) and the top right end of the channel region 64 (see FIG. 2) can be positioned directly under the gate electrode 6D (see FIG. 2). Then, N-type impurity ions are implanted towards the epitaxial layer 2 on which the mask pattern 76 has been formed. Conditions of this ion implantation are, for example, ions of phosphorous, implantation energy of 100 to 400 keV, and dose of the order of 1E11 to 1E13/cm². After the ion implantation, the mask pattern 76 is removed.

Figure 4G:
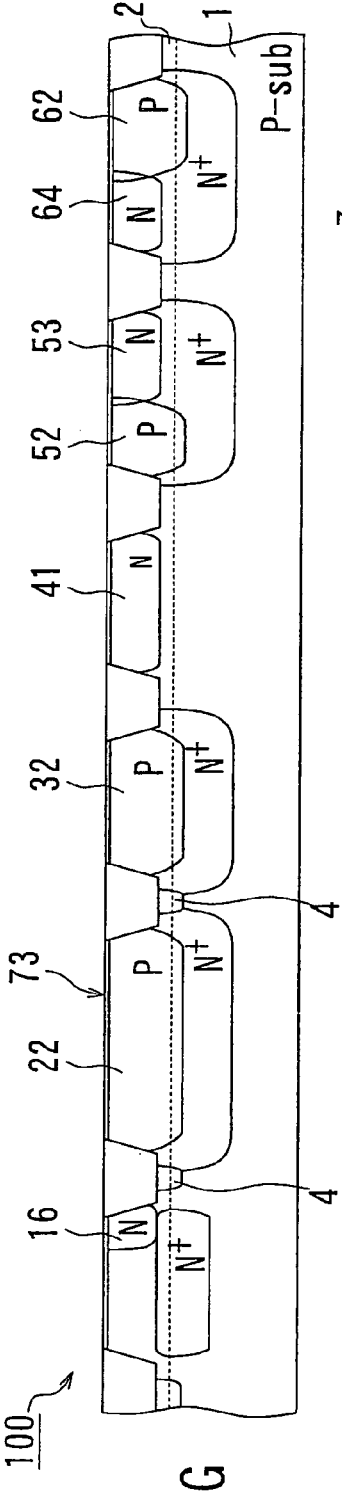
FIG. 4G is a cross-sectional diagram depicting an example of simultaneous formation of collector, well, channel, and drain regions as well as element isolation wells.

Then, the semiconductor substrate 1 is annealed for about 10 to 60 minutes, for example, in a nitrogen atmosphere at 900 to 1100° C. As a result, as is shown in FIG. 4G, the collector region 22, the well region 32, the channel region 52, the drain region 62, and the element isolation wells 4 can be formed simultaneously, and the collector contact region 16, the well region 41, the drain region 53, and the channel region 64 can also be formed simultaneously. In this relation, different conditions of ion implantation can be set for the collector region 22, the well region 32, the channel region 52, the drain region 62, and the element isolation wells 4 according to the performance characteristics of each transistor. Then, the silicon nitride film 73 is removed by wet etching or the like.

Figure 4H:
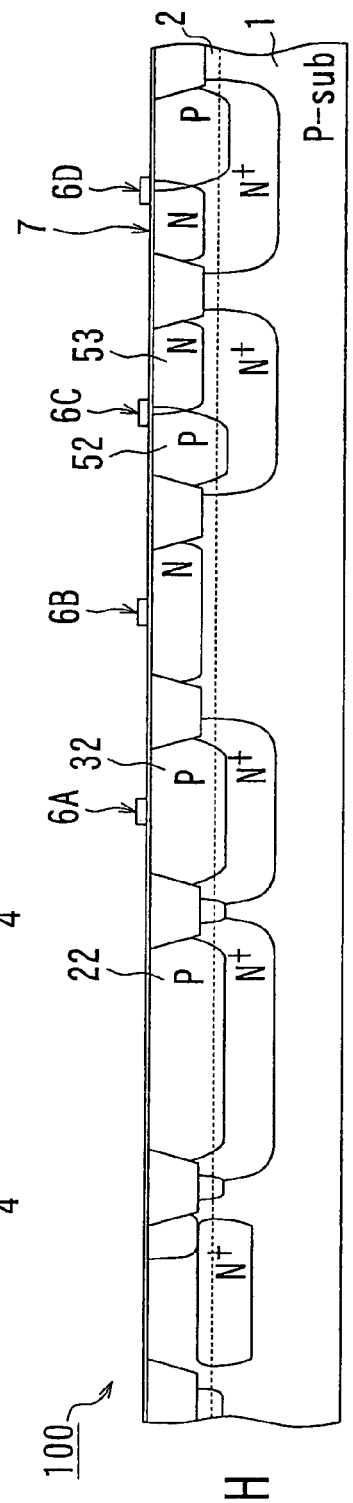
FIG. 4H is a cross-sectional diagram depicting an example of growing a gate oxide film over the semiconductor substrate 1.

Next, as is shown in FIG. 4H, a gate oxide film (silicon oxide film) 7 in the order of 10 to 50 nm thick, which is an example of an insulative film, is grown on the epitaxial layer 2. Besides, a polysilicon film in the order of 100 to 300 nm thick, which is an example of a dielectric film, is grown on the gate oxide film 7. Then, in order to make this polysilicon film conductive, for example, N-type impurities are doped into the polysilicon film. Then, the polysilicon film is shaped into predetermined forms as the gate electrodes 6A to 6D by photolithography and dry etching.

Next, a mask pattern (not shown) is formed on the top of the semiconductor substrate 1 to open only the top left portion of the collector region 22 shown in FIG. 4H. From above this mask pattern, N-type impurity ions are implanted towards the semiconductor substrate 1. As a result, the base region 23 (see FIG. 2) is formed in the collector region 22.

Conditions of this ion implantation are, for example, ions of phosphorous, implantation energy of 100 to 200 keV, and dose of the order of 1E13 to 1E14/cm². After the ion implantation, the mask pattern is removed. Besides, a mask pattern (not shown) is formed on the top of the semiconductor substrate 1 to open only a part of the top left portion of the collector region 22, the P-type well region 32 exposed out of the gate electrode 6A, the P-type channel region 52 exposed out of the gate electrode 6C, and the right-hand portion of the N-type drain region 53, which are shown in FIG. 4H. From above this make pattern, N-type impurity ions are implanted towards the semiconductor substrate 1.

Figure 4I:
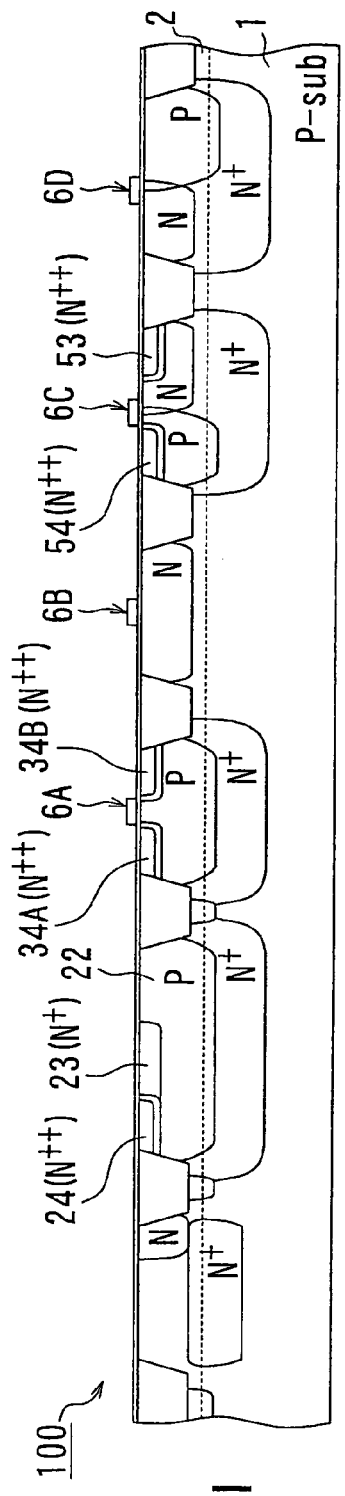
FIG. 4I is a cross-sectional diagram depicting an example of implanting arsenic ions in the semiconductor substrate 1.

As a result, the base contact region 24 for the V-PNP, the source region 34A and drain region 34B for the NMOS, and the source region 54 and drain contact region 55 for the HV-HMOS can be formed simultaneously, as is shown in FIG. 4I. Conditions of this ion implantation are, for example, ions of As (arsenic), implantation energy of 20 to 80 keV, and dose of the order of 1E14 to 1E16/cm². In order to suppress the hot carrier phenomenon, additional N-type impurity ions may be implanted into the source region 34A and drain region 34B for the NMOS, the source region 54 and drain contact region 55 for the HV-NMOS, and the base contact region 24. Through this effect, the source regions and drain (contact) regions of DDD structure can be formed. Conditions of the ion implantation in this case are, for example, ions of phosphorous, implantation energy of 20 to 50 keV, and dose of the order of 1E14 to 1E15/cm². After the ion implantation, the mask pattern is removed.

Figure 4J:
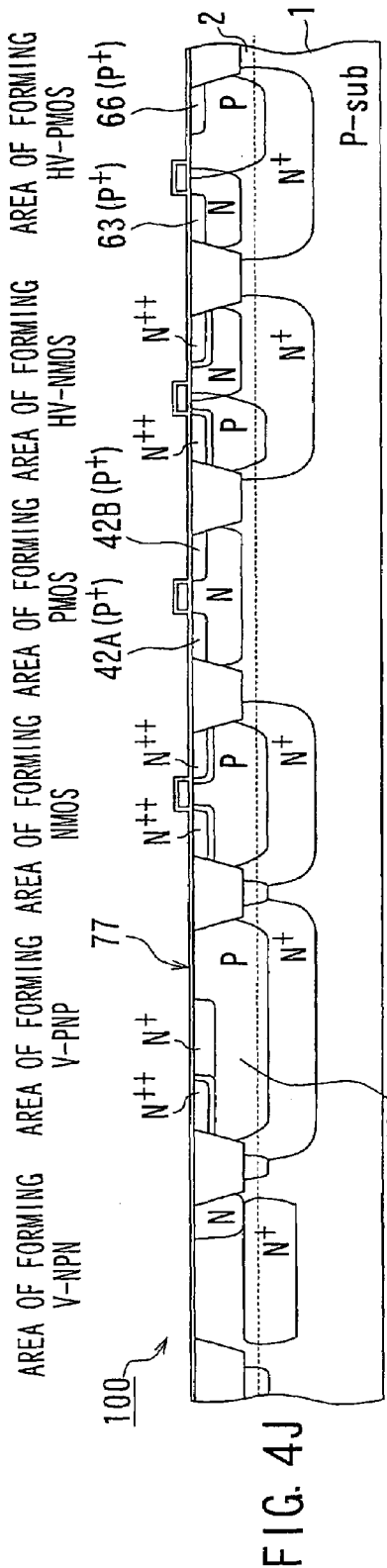
FIG. 4J is a cross-sectional diagram depicting an example of growing a silicon oxide film over the semiconductor substrate 1.

Next, a mask pattern (not shown) is formed on the top of the semiconductor substrate 1 to open only the N-type well region 41 exposed out of the gate electrode 6B, the N-type channel region 64 exposed out of the gate electrode 6D, and the right-hand portion of the P-type source region 63, which are shown in FIG. 4I. From above this mask pattern, P-type impurity ions are implanted towards the semiconductor substrate 1. Conditions of this ion implantation are, for example, ions of boron, implantation energy of 10 to 40 keV, and dose of the order of 1E14 to 1E16/cm². As a result, the source region 42A and drain region 42B for the PMOS, the source region 63 and drain contact region 66 for the HV-PMOS can be formed simultaneously, as is shown in FIG. 4J. After the ion implantation, the mask pattern is removed.

Next, a silicon oxide film 77 in the order of 50 to 200 nm thick is grown, entirely covering the top of semiconductor substrate 1, which is shown in FIG. 4J. A mask pattern (not shown) is formed on the silicon oxide film 77 to open only a part of the area of forming V-NPN (where the base and emitter will be formed), the right-hand portion of the base region 12 (where the emitter will be formed), and a part of the collector region 22. Then, the silicon oxide film 77 exposed out of the mask pattern is etched and removed. Next, the mask pattern on the silicon oxide film 77 is removed and a second polysilicon film is grown, entirely covering the top of the semiconductor substrate 1, which is shown in FIG. 4J. Ions such as BF2 are implanted into the second polysilicon film. Conditions of this ion implantation are, for example, implantation energy of 10 to 100 keV and dose of the order of 1E14 to 1E16/cm².

Figure 4K:
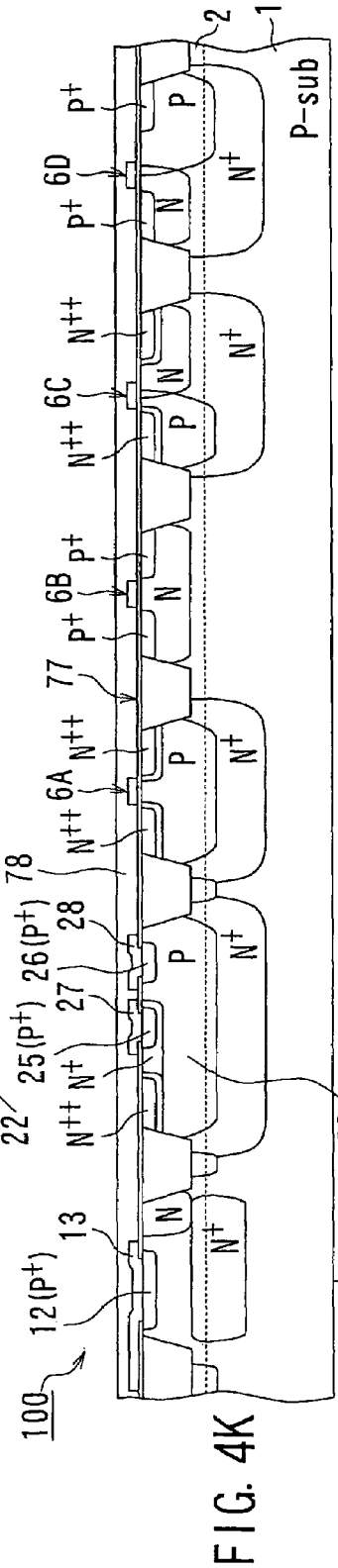
FIG. 4K is a cross-sectional diagram depicting an example of simultaneous formation of base, emitter, and collector regions.

Next, the second polysilicon film is shaped into predetermined forms by photolithography and dry etching, thereby forming the base contact electrode 13, the emitter electrode 27, and the collector electrode 28, which are shown in FIG. 4K.

Next, a first interlayer insulation film 78 is grown, entirely covering the top of the semiconductor substrate 1. This interlayer insulation film 78 is, for example, a silicon oxide film. For example, the CVD is performed to grow the interlayer insulation film 78. Besides, the semiconductor substrate 1 on which the interlayer insulation film 78 has been grown is thermally processed (annealed). Conditions of this annealing are, for example, a nitrogen atmosphere, annealing temperature of 800 to 1000° C., and duration of about 10 to 60 minutes. As a result, the boron ions implanted in the base contact electrode 13, the emitter electrode 27, and the collector electrode 28 are diffused into the internal portions of the epitaxial layer 2 so that the base region 12 of the NPN transistor 10 and the emitter region 25 and collector region 22 of the PNP transistor 20 are formed simultaneously, as is shown in FIG. 4K.

Figure 4L:
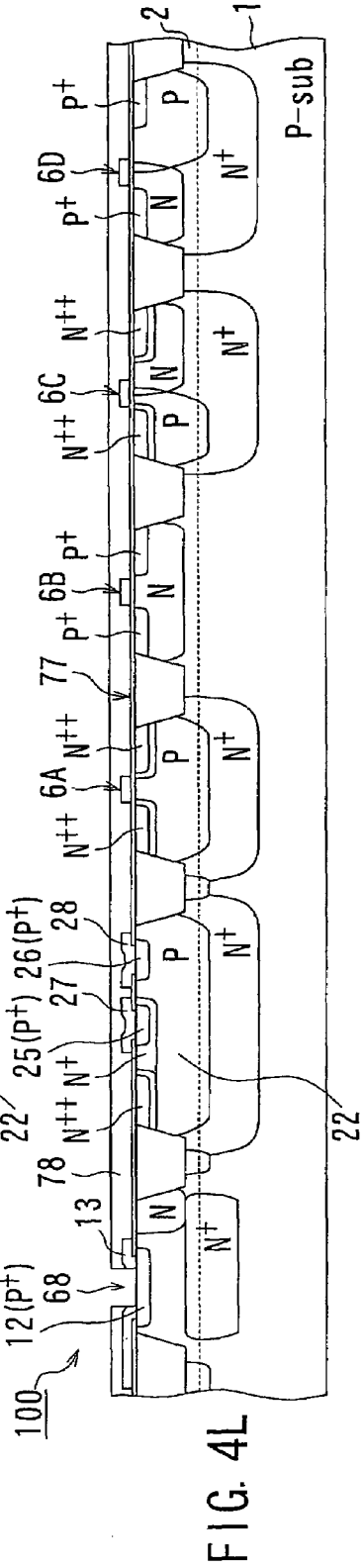
FIG. 4L is a cross-sectional diagram depicting an example of selective removal of an interlayer insulation film and a base contact electrode.

Then, a mask pattern (not shown) is formed on the interlayer insulation film 78 to open only a center portion of the base region 12. As is shown in FIG. 4L, the interlayer insulation film 78 and the base contact electrode 13 just above the center portion of the base region 12 are removed, thereby forming a hole 68. This selective removal of the interlayer insulation film 78 and the base contact electrode 13 is performed by anisotropic dry etching or the like. After the mask pattern is removed, an insulation film 79 is grown, entirely covering the top of the semiconductor substrate 1, including the exposed center portion of the base region 12, as is shown in FIG. 4M. This insulation film 79 may be, for example, a silicon oxide film, silicon nitride film, or other suitable one, and is grown by the CVD.

Next, all the surface of the insulation film 79 is etched back by Reactive Ion Etching (RIE) or the like. This etching back is conditioned on anisotropic etching, so that the etching of the insulation film 79 can proceed, reflecting the shape of the insulation film 79 as it is. This etching back should terminate when the semiconductor substrate surface in the center portion of the base region 12 has been exposed. In consequence, a side wall 69 is formed on the inside wall surfaces of the hole 68 formed just above the center portion of the base region 12, as is shown in FIG. 4N.

Next, a third polysilicon film is grown, entirely converting the top of the semiconductor substrate 1, including the side wall 69. Then, N-type impurity ions, such as phosphorous, are implanted into the third polysilicon film. Besides, on the third polysilicon film, a CVD oxide film (not shown) is grown and annealed. Through this annealing, the N-type impurity ions implanted in the third polysilicon film are diffused into the base region 12, thereby forming the emitter region 14 for the V-NPN, which is shown in FIG. 4O. After the emitter region 14 is formed, the CVD oxide film is removed by wet etching and the third polysilicon film is exposed. The third polysilicon film is shaped into predetermined forms through photolithography and dry etching, thereby forming the emitter contact electrode 15, as shown in FIG. 4O.

Next, the second interlayer insulation film 5 (see FIG. 2) is grown, entirely converting the top of the semiconductor substrate 1. For example, the CVD is performed to grow this interlayer insulation film 5. Then, predetermined holes are selectively formed in the second interlayer insulation film 5 and the first interlayer insulation film 78, via plugs are installed, and a predetermined wiring pattern is formed. Then, the semiconductor device 100 shown in FIG. 2 is complete.

In the above-described method of fabricating the semiconductor device 100 according to the present invention, because phosphorous ions are implanted into the semiconductor substrate 1 in the area of forming V-PNP, the area of forming HV-NMOS, and the area of forming HV-PMOS, the substrate isolation layer 21, the drain buried layer 51, and the back gate buried layer 61 can be formed simultaneously. Also, because, after the N-type epitaxial layer 2 is formed on the semiconductor substrate 1, boron ions are implanted into the epitaxial layer 2 in the area of forming V-PNP, the predetermined portion of the area of forming HV-NMOS, and the predetermined portion of the area of forming HV-PMOS, the collector region 22, the channel region 52, and the drain region 62 can be formed simultaneously.

Besides, because arsenic ions are implanted in the predetermined portion of the base region 23 in the area of forming V-PNP, and the channel region 52 exposed out of the gate electrode 6C and the predetermined portion of the drain region 53 in the area of forming HV-NMOS, the base contact region 24, the source region 54, and the drain contact region 55 can be formed simultaneously. Therefore, the semiconductor device 100 including the V-PNP 20 with easily controllable performance characteristics, such as the current amplification factor, and the HV-NMOS 50 and HV-PMOS 60 with high dielectric strength can be fabricated through a reduced number of processes and with good reproducibility. While, in the described embodiment, a example of a semiconductor device in which the one conductive type is a P-type and the opposite conductive type is a N-type has been described, the invention should not be limited to this, and a similar semiconductor device in which the one conductive type is a N-type and the opposite conductive type is a P-type may be fabricated in the same manner. In the latter case, a semiconductor device including both a vertical NPN bipolar transistor with easily controllable performance characteristics, such as the current amplification factor, and field effect transistors with high dielectric strength can be fabricated through a reduced number of processes.

INDUSTRIAL APPLICABILITY

This invention is quite suitable for application to BiCMOS ICs which are used for dynamic range output circuits and the like in electronic circuitry to perform signal amplification and recording.

The invention claimed is:

1. A semiconductor device comprising a bipolar transistor having an emitter and a collector of one conductive type and a base of an opposite conductive type, a field effect transistor of the opposite conductive type, a field effect transistor of the one conductive type, a first semiconductor layer of the one conductive type on which the transistors are formed, a second semiconductor layer of the opposite conductive type, formed on said first semiconductor layer, said bipolar transistor including:

a first impurity diffusion layer of the opposite conductive type for interlayer isolation use, formed between said second semiconductor layer and said first semiconductor layer;

a second impurity diffusion layer of the one conductive type for collector use, formed in said second semiconductor layer region over said first impurity diffusion layer;

a third impurity diffusion layer of the opposite conductive type for base use, formed on one side of said second impurity diffusion layer;

a fourth impurity diffusion layer of the opposite conductive type for base contact use, formed on one side of said third impurity diffusion layer;

a fifth impurity diffusion layer of the one conductive type for emitter use, formed on the other side of said third impurity diffusion layer; and a sixth impurity diffusion layer of the one conductive type for collector contact use, formed on the other side of said second impurity diffusion layer, said field effect transistor of the opposite conductive type including:

a first impurity diffusion layer of the opposite conductive type for drain burying use, formed between said second semiconductor layer and said first semiconductor layer;

a second impurity diffusion layer of the one conductive type for channel use, formed on one side of said second semiconductor layer region over said first impurity diffusion layer for drain burying use;

a third impurity diffusion layer of the opposite conductive type for source use, formed in said second impurity diffusion layer for channel use; and a fourth impurity diffusion layer of the opposite conductive type for drain contact use, formed on the other side of said second semiconductor layer region, and said field effect transistor of the one conductive type including:

a first impurity diffusion layer of the opposite conductive type for back gate use, formed between said second semiconductor layer and said first semiconductor layer;

a second impurity diffusion layer of the one conductive type for drain use, formed on one side of said second semiconductor layer region over said first impurity diffusion layer for back gate use;

a third impurity diffusion layer of the one conductive type for source use, formed on the other side of said second semiconductor layer region; and a fourth impurity diffusion layer of the one conductive type for drain contact use, formed in said second impurity diffusion layer for drain use, wherein the first impurity diffusion layer of said bipolar transistor, the first impurity diffusion layer of said field effect transistor of the opposite conductive type, and the first impurity diffusion layer of said field effect transistor of the one conductive type are formed simultaneously by selectively implanting impurities of the opposite conductive type in said first semiconductor layer, wherein said second impurity diffusion layer of said bipolar transistor is a P-type collector region, wherein said third impurity diffusion layer of said bipolar transistor is an N-type base region, and wherein said fourth impurity diffusion layer of said bipolar transistor is an N-type base contact region.

2. The semiconductor device according to claim 1 wherein the second impurity diffusion layer for collector use of said bipolar transistor, the second impurity diffusion layer for channel use of said field effect transistor of the opposite conductive type, the second impurity diffusion layer for drain use of said field effect transistor of the one conductive type are formed simultaneously by selectively implanting impurities of the one conductive type into the second semiconductor layer of the opposite conductive type formed on said first semiconductor layer.

3. The semiconductor device according to claim 1 wherein the fourth impurity diffusion layer for base contact use of said bipolar transistor, the third impurity diffusion layer for source use of said field effect transistor of the opposite conductive type, and the fourth impurity diffusion layer for drain contact use of said field effect transistor of the opposite conductive type are formed simultaneously by selectively implanting impurities of the opposite conductive type into the third impurity diffusion layer of the opposite conductive type for base use of the bipolar transistor, the second impurity diffusion layer of the one conductive type for channel use of the field effect transistor of the opposite conductive type, and the second semiconductor layer of the opposite conductive type.

4. A method of fabricating a semiconductor device wherein a bipolar transistor having an emitter and a collector of one conductive type and a base of an opposite conductive type, a field effect transistor of the opposite conductive type, and a field effect transistor of the one conductive type are formed on a first semiconductor layer of the one conductive type, said method comprising:

a step of confining in advance a first area of forming said bipolar transistor, a second area of forming said field effect transistor of the opposite conductive type, and a third area of forming said field effect transistor of the one conductive type, respectively, on said first semiconductor layer;

a step of forming a first impurity diffusion layer for interlayer isolation use, a first impurity diffusion layer for drain burying use, and a first impurity diffusion layer for back gate use by implanting impurities of the opposite conductive type in the first semiconductor layer in said first, second, and third areas, respectively;

a step of forming a second semiconductor layer of the opposite conductive type on the first semiconductor layer in which the first impurity diffusion layers have been formed in said first, second, and third areas, respectively;

a step of forming a second impurity diffusion layer for collector use, a second impurity diffusion layer for channel use, and a second impurity diffusion layer for drain use by implanting impurities of the one conductive type into the second semiconductor layer in said first area, a predetermined portion of said second area, and a predetermined portion of said third area, respectively;

a step of growing an insulative film and a conductive film on the second impurity diffusion layer in said second area and on the second semiconductor layer in said third area, shaping the insulative film and the conductive film into predetermined forms, and thus forming a first electrode and a second electrode for gate use, respectively;

a step of forming a third impurity diffusion layer for base use by implanting impurities of the opposite conductive type into a predetermined portion of the second impurity diffusion layer in said first area;

a step of forming a fourth impurity diffusion layer for base contact use, a third impurity diffusion layer for source use, and a fourth impurity diffusion layer for drain contact use by implanting impurities of the opposite conductive type into a predetermined portion of the third impurity diffusion layer in said first area, the second impurity diffusion layer exposed out of the first electrode in said second area, and a predetermined portion of the second semiconductor layer in said second area, respectively;

a step of forming a third impurity diffusion layer for source use and a fourth impurity diffusion layer for drain contact use by implanting impurities of the one conductive type into the second semiconductor layer exposed out of the second electrode in said third area and a predetermined portion of the second impurity diffusion layer in said third area, respectively; and a step of forming a fifth impurity diffusion layer for emitter use and a sixth impurity diffusion layer for collector contact use by implanting impurities of the one conductive type into a predetermined portion of the third impurity diffusion layer in said first area and a predetermined portion of the second impurity diffusion layer in said first area, respectively wherein said second impurity diffusion layer for collector use is a P-type collector region, wherein said third impurity diffusion layer for base use is an N-type base region, and wherein said fourth impurity diffusion layer for base contact use is an N-type base contact region.

5. The method of fabricating a semiconductor device according to claim 4, further comprising a step of forming a fifth impurity diffusion layer for drain use and a fifth impurity diffusion layer for channel use, respectively, by implanting impurities of the opposite conductive type into the second semiconductor layer in a specified portion of said second area including one end of the second impurity diffusion layer and in a specified portion of said third area including one end of the second impurity diffusion layer, after forming the second impurity diffusion layer for channel use and the second impurity diffusion layer for drain use by implanting impurities of the one conductive type into a predetermine portion of the second semiconductor layer in said second area and a predetermined portion of the second semiconductor layer in said third area, respectively.

6. The method of fabricating a semiconductor device according to claim 4 wherein said fourth impurity diffusion layer for base contact use, said third impurity diffusion layer for source use, and said fourth impurity diffusion layer for drain contact use are respectively formed by implanting impurities of the opposite conductive type a plurality of times under different conditions of implantation into the predetermined portion of the third impurity diffusion layer in said first area, the second impurity diffusion layer exposed out of the first electrode in said second area, and the predetermined portion of the second semiconductor layer in said second area.

\* \* \* \* \*